United States Patent
Okumura

(10) Patent No.: US 9,885,115 B2
(45) Date of Patent: Feb. 6, 2018

(54) PLASMA TREATMENT APPARATUS AND PLASMA TREATMENT METHOD

(71) Applicant: Panasonic Corporation, Osaka (JP)

(72) Inventor: Tomohiro Okumura, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 13 days.

(21) Appl. No.: 13/688,633

(22) Filed: Nov. 29, 2012

(65) Prior Publication Data

US 2013/0146564 A1    Jun. 13, 2013

(30) Foreign Application Priority Data

Dec. 7, 2011    (JP) .................................. 2011-267962

(51) Int. Cl.
| | | |
|---|---|---|
| *C23C 16/00* | (2006.01) | |
| *H01L 21/326* | (2006.01) | |
| *C23C 16/505* | (2006.01) | |
| *H01J 37/32* | (2006.01) | |
| *B44C 1/22* | (2006.01) | |

(Continued)

(52) U.S. Cl.
CPC ............ *C23C 16/505* (2013.01); *B44C 1/227* (2013.01); *C23C 16/513* (2013.01); *H01J 37/321* (2013.01); *H01J 37/32357* (2013.01); *H05H 1/30* (2013.01)

(58) Field of Classification Search
CPC ............... H01J 37/32082; H01J 37/321; H01J 37/3211; H01J 37/32357; H01J 37/32119
USPC ...... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 6,030,667 A | * | 2/2000 | Nakagawa ............ | H01J 37/321 118/723 I |
| 6,262,386 B1 | * | 7/2001 | Fornsel .................... | H05H 1/34 219/121.39 |

(Continued)

FOREIGN PATENT DOCUMENTS

| | | |
|---|---|---|
| CN | 1453831 | 11/2003 |
| CN | 1559077 | 12/2004 |

(Continued)

OTHER PUBLICATIONS

Toyonobu Yoshida, Plasmas for Material Processing Thermal (Equilibrium) Plasmas, Journal of Plasma and Fusion Research, Jul. 1993, pp. 772-778, vol. 69, No. 7, Faculty of Engineering, University of Tokyo, Tokyo 113, Japan.

(Continued)

*Primary Examiner* — Luz L Alejandro Mulero
(74) *Attorney, Agent, or Firm* — Panasonic IP Management

(57) ABSTRACT

A plasma treatment apparatus that includes a chamber having an opening portion which serves as a plasma ejection port surrounded by a dielectric member; a gas supply pipe that introduces gas into an inside of the chamber; a solenoid coil disposed in a vicinity of the chamber; a high-frequency power supply having a pulse modulation function which is connected to the solenoid coil; and a base material mounting table disposed on a plasma ejection port side. Plasma can be stably generated using the plasma treatment apparatus.

1 Claim, 5 Drawing Sheets

(51) Int. Cl.
*C23C 16/513* (2006.01)
*H05H 1/30* (2006.01)

(56) References Cited

U.S. PATENT DOCUMENTS

| | | | |
|---|---|---|---|
| 6,312,554 B1 * | 11/2001 | Ye | H01J 37/32192 |
| | | | 118/723 E |
| 6,700,090 B2 | 3/2004 | Ono et al. | |
| 2003/0075522 A1 | 4/2003 | Weichart et al. | |
| 2003/0116089 A1 | 6/2003 | Walther | |
| 2004/0050685 A1 | 3/2004 | Yara et al. | |
| 2004/0182517 A1 * | 9/2004 | Lai | H01J 37/32431 |
| | | | 156/345.48 |
| 2005/0000656 A1 * | 1/2005 | Carr | 156/345.48 |
| 2005/0040145 A1 * | 2/2005 | Okumura | H05H 1/48 |
| | | | 219/121.56 |
| 2007/0243338 A1 * | 10/2007 | Aslami | C23C 16/507 |
| | | | 427/569 |
| 2008/0085604 A1 | 4/2008 | Hoshino et al. | |
| 2009/0004764 A1 | 1/2009 | Ohnuma et al. | |
| 2011/0236593 A1 | 9/2011 | Okino et al. | |

FOREIGN PATENT DOCUMENTS

| | | |
|---|---|---|
| CN | 1981367 | 6/2007 |
| JP | 05-074591 | 3/1993 |
| JP | 09-293600 | 11/1997 |
| JP | 2002-151478 | 5/2002 |
| JP | 2005-533391 | 11/2005 |
| JP | 2007-287452 | 11/2007 |

OTHER PUBLICATIONS

Hironobu Yabuta et al., "Design and evaluation of dual inlet ICP torch for low gas consumption," (2002), pp. 1090-1095, 17, Journal of Analytical Atomic Spectrometry.
English Translation of Chinese Search Report dated Sep. 6, 2015 for the related Chinese Patent Application No. 201210517334.7.
English translation of Search Report which is an annex to Office Action dated Jan. 6, 2015 for corresponding Chinese Patent Application and references listed above.

* cited by examiner

PLASMA TREATMENT APPARATUS AND PLASMA TREATMENT METHOD

TECHNICAL FIELD

The present invention relates to a plasma treatment apparatus and a plasma treatment method. The invention relates to a thermal plasma treatment method in which a thermal plasma is irradiated to a base material so as to treat the base material, a low-temperature plasma treatment method in which a plasma originating from a reactive gas or a plasma and a reactive gas stream are irradiated to a base material at the same time so as to treat the base material, and the like.

BACKGROUND ART

Thus far, an inductively-coupled plasma torch has become well known as a method of generating a high-density thermal plasma in the atmosphere. In the method, high-frequency power is supplied to coils wound on the outside of a cylindrical dielectric chamber so as to generate thermal plasma in the dielectric chamber (for example, refer to Patent Literature 1, Non Patent Literature 1, and Non Patent Literature 2). The inductively-coupled plasma torch is used for plasma spraying, thermal treatments, powder synthesis, element analysis, and the like.

Additionally, a variety of relevant techniques have been disclosed (for example, refer to Patent Literature 2 to 4). For example, Patent Literature 2 discloses a high-frequency atmospheric pressure low-temperature capacitively-coupled plasma (CCP) apparatus that pulse-modulates high-frequency power. Patent Literature 3 discloses a vacuum low-temperature plasma ICP apparatus that pulse-modulates high-frequency power. Patent Literature 4 discloses a vacuum ion injecting apparatus that pulse-modulates high-frequency power.

CITATION LIST

Patent Literature

PTL 1
Patent Document 1: Japanese Patent Application Laid-Open NO. HEI 5-74591
PTL 2
Patent Document 2: Japanese Patent Application Laid-Open NO. 2002-151478
PTL 3
Patent Document 3: Japanese Patent Application Laid-Open NO. HEI 9-293600
PTL 4
Patent Document 4: Japanese Translation of a PCT Application Laid-Open No. 2005-533391

Non-Patent Literature

NPL 1
Toyonobu Yoshida, Journal of Plasma and Fusion Research, 69, 7 (1993) 772
NPL 2
Hironobu Yabuta et. al., "Design and evaluation of dual inlet ICP torch for low gas consumption", Journal of Analytical Atomic Spectrometry, 17 (2002), pp. 1090 to 1095

SUMMARY OF INVENTION

Technical Problem

However, as disclosed in NPL 2, the inductively-coupled plasma torch of the related art has a problem in that the plasma becomes unstable when the gas flow rate increases.

The above problem is considered to be caused by the fact that, when a circular plasma fluctuates in the chamber, the distance between the circular plasma and the coil becomes too far at the downstream area of the gas flow such that inductive coupling cannot be maintained, and thus the plasma is lost.

The invention has been made in consideration of the above problem, and an object of the invention is to provide a plasma treatment apparatus and a plasma treatment method with which a plasma can be stably generated.

Solution to Problem

A first aspect of the invention is a plasma treatment apparatus including (a) a chamber having an opening portion which serves as a plasma ejection port surrounded by a dielectric member, (b) a gas supply pipe that introduces gas into the inside of the chamber, (c) a solenoid coil disposed in the vicinity of the chamber, (d) a high-frequency power supply having a pulse modulation function which is connected to the solenoid coil, and (e) a base material mounting table disposed on the plasma ejection port side. According to the first aspect, it is possible to generate plasma stably. In the first aspect, the chamber is preferably circular. This is because it is possible to generate plasma more stably.

A second aspect of the invention is a plasma treatment method including (a) a process in which a unit including a chamber having an opening portion which serves as a plasma ejection port surrounded by a dielectric member and a solenoid coil disposed in the vicinity of the chamber is prepared, and (b) a process in which gas is exhausted toward a base material from the opening portion while the gas is supplied to the inside of the chamber, and high-frequency power is supplied to the solenoid coil so as to generate a high-frequency electromagnetic field in the chamber and thus generate plasma, thereby carrying out a plasma treatment on the surface of the base material, in which (c) the high-frequency power is controlled to be on or off in a pulse mode in the process in which the plasma treatment is carried out. According to the second aspect, it is possible to generate plasma stably. In the second aspect, the on time in pulse modulation is preferably 100 μs to 10 ms. This is because it is possible to generate plasma more stably.

Advantageous Effects of Invention

According to the invention, it is possible to provide a plasma treatment apparatus and a plasma treatment method with which plasma can be stably generated.

DESCRIPTION OF EMBODIMENTS

Hereinafter, plasma treatment apparatuses of embodiments of the invention will be described using the accompanying drawings.

Plasma Treatment Apparatus

Embodiment 1

Figure 1:
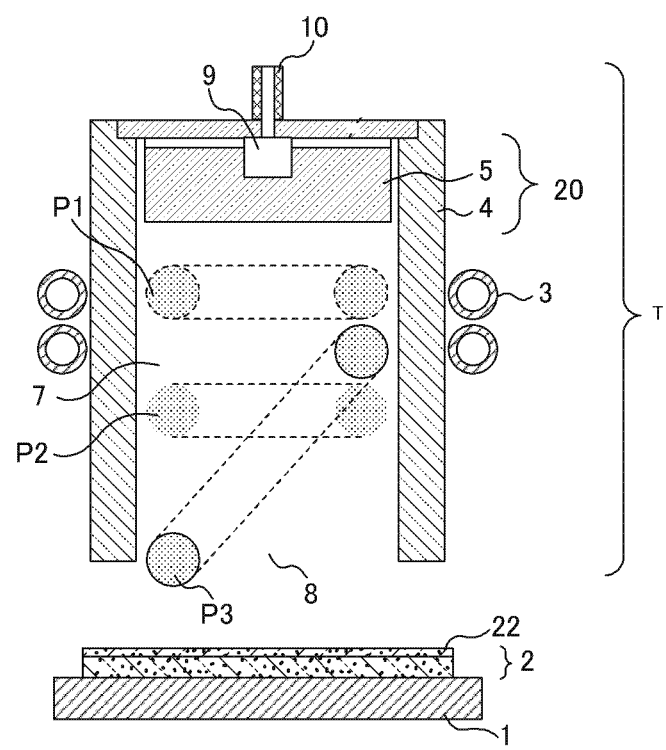
FIG. 1 is a cross-sectional view showing the outline of a plasma treatment apparatus according to Embodiment 1.

FIG. 1 is a cross-sectional view showing the outline of a plasma treatment apparatus according to Embodiment 1. FIG. 1 illustrates a state of the plasma treatment apparatus in use which has base material 2 disposed on base material mounting table 1 and thin film 22 plasma-treated on the surface of base material 2. FIG. 1 is a cross-sectional view of inductively-coupled plasma torch unit T cut at a surface perpendicular to base material 2.

As shown in FIG. 1, the plasma treatment apparatus has base material mounting table 1 and inductively-coupled plasma torch unit (hereinafter also referred to as the "unit") T disposed on base material mounting table 1.

Unit T has chamber 20 which includes outside dielectric block 4 having plasma ejection port 8 at the bottom end and inside dielectric block 5 disposed at the top end of outside dielectric block 4, and is formed of a dielectric member. Inside dielectric block 5 has gas pipe (plasma gas manifold) 9 that is communicated with outside so that gas can be supplied to inside 7 of chamber 20.

Unit T has gas supply pipe 10 that introduces gas into inside 7 of chamber 20 through gas pipe 9 in inside dielectric block 5, cylindrical solenoid coil (hereinafter also referred to as the "coil") 3 formed of a conductor disposed on the outer periphery of chamber 20, and a high-frequency power supply which is connected to coil 3 and has a pulse modulation function (not shown).

As such, inside 7 of chamber 20 is surrounded by a dielectric body. It is possible to generate plasma in inside 7 of chamber 20 by supplying high-frequency power to coil 3 while gas is supplied to inside 7 of chamber 20. Here, chamber 20 is made to have a (long) cylindrical shape which is long and thin in the direction of gravitational force. However, the shape of chamber 20 is not particularly limited, and may be a hollow cuboid with no bottom surface.

The plasma treatment apparatus preferably further has a moving mechanism (not shown) that relatively moves chamber 20 and base material mounting table 1. This is because it is possible to treat large-scale substrates and the like within a short period of time without increasing the size of the plasma treatment apparatus. The pulse modulation function preferably carries out the on-off control of the high-frequency power supply based on the following formulae 1 and 2 when the diameter of the plasma ejection port (hereinafter also referred to as the "opening portion") 8 of chamber 20 is represented by D, and the movement rate is represented by V, $$D/V > \text{off time} \quad \text{(Formula 1)}$$

$$D/V \times 0.1 > \text{off time} \quad \text{(Formula 2)}$$

Inductively-coupled plasma torch unit T is preferably surrounded by a conductor shield member (not shown) which is completely grounded. This is because it is possible to effectively prevent the leakage (noise) of high-frequency waves and to effectively prevent non-preferable abnormal discharge and the like. Coil 3 preferably includes a hollow copper tube, and forms a coolant flow channel in the inside. This is because it is possible to cool inductively-coupled plasma torch unit T by flowing a coolant such as water.

[Waveform of High-Frequency Power]

The waveform of high-frequency power supplied to coil 3 will be described.

The present inventors observed plasma in detail using a high-speed camera and the like in a process in which high-frequency power having a so-called continuous wave (CW) is supplied. As a result, it was found that doughnut-like plasma portions (hereinafter referred to as "doughnut plasma") from which plasma emit light most brightly change from moment to moment into the states as shown by P1, P2, and P3 in FIG. 1 (hereinafter referred to as the "fluctuation of the plasma"). In addition, as a result of additional studies, the inventors found that (a) the doughnut plasma comes out from inside 7 of chamber 20 to outside as shown by P3, (b) when the distance between coil 3 and a part of the doughnut plasma becomes too far, the doughnut plasma is not maintained and lost, and (c) the speed of the fluctuation of the plasma becomes faster as the gas flow rate increases.

Based on the above findings, the inventors considered a method for pulse-modulating the high-frequency power supplied to coil 3. This method is to fix the doughnut plasma at a stable location by carrying out on/off controls of high frequencies faster than the speed of the fluctuation of the plasma. As a result of experiments, it was found that it is possible to stably generate plasma having favorable reproducibility by sufficiently shortening the on time of the pulse.

Furthermore, the inventors found that the on time in the pulse modulation is desirably 100 μs to 10 ms, and the off time is desirably set to 50 μs or more.

The invention is based on the above findings. Hereinafter, the invention will be described by describing a plasma treatment method in which the plasma treatment apparatus of FIG. 1 is used.

[Plasma Treatment Method]

(a) Firstly, the plasma treatment apparatus as shown in FIG. 1 is prepared.

(b) Next, gas is injected from gas supply pipe 10. In addition, the gas is introduced into inside 7 of chamber 20 through gas pipe 9. As the gas supplied into chamber 20, a variety of gases can be used. When the safety and ignition properties of plasma, the life span of members exposed to plasma, and the like are taken into account, the gas desirably includes mainly an inert gas. For example, argon (Ar) gas or a gas mixture (Ar+$H_2$) can be used. Among the above, Ar gas is preferable. Meanwhile, in a case in which plasma is generated using only Ar gas, the plasma reaches a significantly high temperature (10,000 K or higher).

(c) High-frequency electric power of 13.56 MHz is supplied to coil 3 disposed at the outer periphery of chamber 20. In addition, a high-frequency electromagnetic field is generated in chamber 20. In addition, plasma is generated between the inside side surface of outside dielectric block 4 and the side surface of inside dielectric block 5 in chamber 20. Meanwhile, the process (c) may be performed at the same time as the process (b), but is preferably performed after the process (b).

(d) Meanwhile, base material 2 is prepared, and base material 2 is disposed on base material mounting table 1 of FIG. 1. The process (d) is preferably performed at a location away from chamber 20, for example, at the side of chamber 20, or the like.

(e) Chamber 20 is disposed above base material 2, and base material 2 is irradiated with the plasma generated in inside 7 of chamber 20 from plasma ejection port 8. In addition, a plasma treatment is performed on the surface of base material 2 using the plasma.

(f) Base material 2 is scanned using chamber 20 by relatively moving base material 2 and chamber 20 perpendicularly with respect to plasma ejection port 8. The process (f) may be performed at the same time as the process (e), but chamber 20 is preferably scanned over base material 2 when the moving rate of chamber 20 becomes constant.

Using the above processes, a plasma treatment can be carried out on thin film 22 on base material 2. In addition, it is possible to perform a plasma treatment such as a thermal treatment, spraying, film formation, and etching by irradiating plasma to base material 2 from plasma ejection port 8.

(g) In the plasma treatment processes of the above (c) to (f), the high-frequency power is preferably controlled to be on and off in a pulse mode. In addition, the on time in the pulse modulation is preferably 100 μs to 10 ms. This is because, when the on time is shorter than the above lower limit value, the reflective wave of the high-frequency power increases, and the control becomes difficult. Conversely, this is because, when the on time is far longer than the upper limit value, it becomes difficult to control the fluctuation of plasma.

The off time in the pulse modulation is preferably 50 μs or more. This is because, when the off time is too short, plasma is completely lost during the off time, and it becomes impossible to control the fluctuation of plasma. Therefore, the off time is desirably 50 μs or more. As the duty ratio (the on time/(the on time+the off time)) increases, a decrease in the treatment rate is suppressed. Therefore, the duty ratio is desirably large. The duty ratio is a parameter that is supposed to be determined in balance with the suppression degree of the fluctuation of plasma. The duty ratio is desirably approximately 50% to 90%.

In the process in which a plasma treatment is carried out, the treatment is preferably carried out while relatively moving (scanning) unit T and base material mounting table 1. This is because, even when the plasma treatment subject is a large-scale substrate, it is possible to carry out the plasma treatment within a short period of time. In a case in which entire base material 2 is treated, it is preferable to set the off time to be sufficiently shorter than the time in which plasma ejection port 8 passes through an arbitrary point on base material 2. For example, when the diameter of plasma ejection port 8 is represented by D, and the movement (scanning) rate is represented by V, the time in which plasma ejection port 8 passes through an arbitrary point on base material 2 is represented by D/V. Therefore, the high-frequency power is preferably controlled to be on and off based on the following formulae 1 and 2, $$D/V > \text{off time} \quad \text{(Formula 1)}$$

$$D/V \times 0.1 > \text{off time} \quad \text{(Formula 2)}.$$

Among the above formulae, the high-frequency power is preferably controlled based on Formula 2. This is derived from the fact that, in a majority of plasma treatments, the uniformity of the treatment rate is required to be within a variation of 10% or less.

In the process in which a plasma treatment is carried out, the shape of plasma ejection port 8 is preferably made to have a long and thin (long) linear shape, and the treatment is preferably carried out while relatively moving the chamber and the base material mounting table perpendicularly with respect to the longitudinal direction. This is because it is possible to decrease the size of the plasma treatment apparatus. In addition, this is because it is possible to carry out a plasma treatment of a large-scale substrate or the like within a short period of time. In this case, when the opening width (the opening width that is perpendicular to the longitudinal direction) of the opening portion is represented by D, and the movement rate is represented by V, the high-frequency power is preferably controlled to be on and off based on the following formulae 1 and 2, $$D/V > \text{off time} \quad \text{(Formula 1)}$$

$$D/V \times 0.1 > \text{off time} \quad \text{(Formula 2)}.$$

This is because it is possible to carry out a plasma treatment with favorable uniformity on a plasma treatment subject. Among the above formulae, the high-frequency power is preferably controlled based on Formula 2.

Embodiment 2

Figure 2:
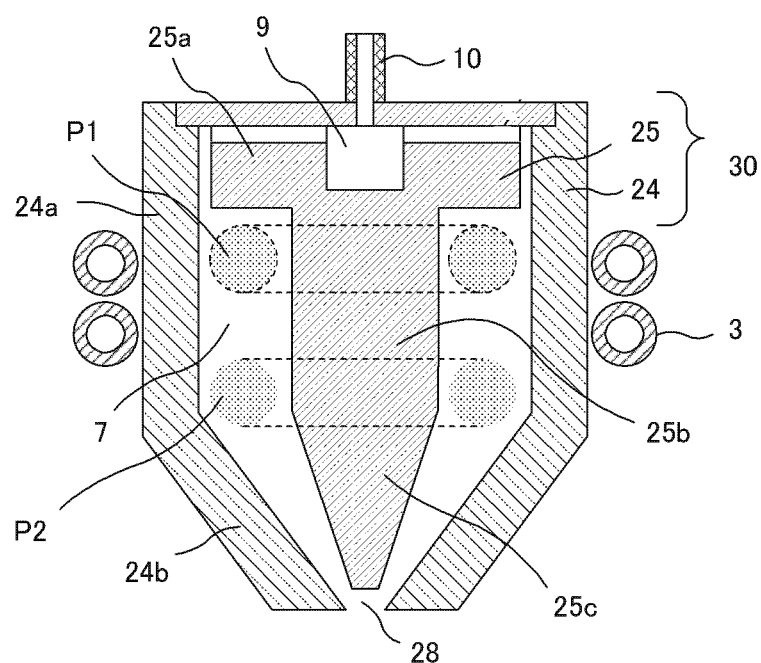
FIG. 2 is a cross-sectional view showing the outline of a plasma treatment apparatus according to Embodiment 2.

FIG. 2 is a cross-sectional view showing the outline of a plasma treatment apparatus according to Embodiment 2. FIG. 2 is a cross-sectional view of inductively-coupled plasma torch unit T cut at a surface perpendicular to base material 2. Description will be made with the focus on the difference from Embodiment 1.

The plasma treatment apparatus according to Embodiment 2 is configured in the same manner as in Embodiment 1 except that chamber 20 is substituted by chamber 30.

Chamber 30 includes outside dielectric block 24 having plasma ejection port 28 at the bottom end and inside dielectric block 25 disposed at the top end of outside dielectric block 24. Outside dielectric block 24 and inside dielectric block 25 are formed of a dielectric member.

Outside dielectric block 24 includes cylindrical outside dielectric block main body 24a having a plasma generation area formed in inside 7 and taper portion 24b having plasma ejection port 28 at the bottom end whose diameter becomes narrower in a direction from the opening portion of outside dielectric block main body 24a on mounting table 1 side toward base material mounting table 1.

As shown in FIG. 2, inside dielectric block 25 is formed of inside dielectric block main body 25a having gas supply pipe 10 that is communicated with outside, protrusion 25b which is provided in a protruding manner from inside dielectric block main body 25a and has a diameter that is smaller than that of inside dielectric block main body 25a, and taper portion 25c provided at the front end of protrusion 25b.

Figure 3:
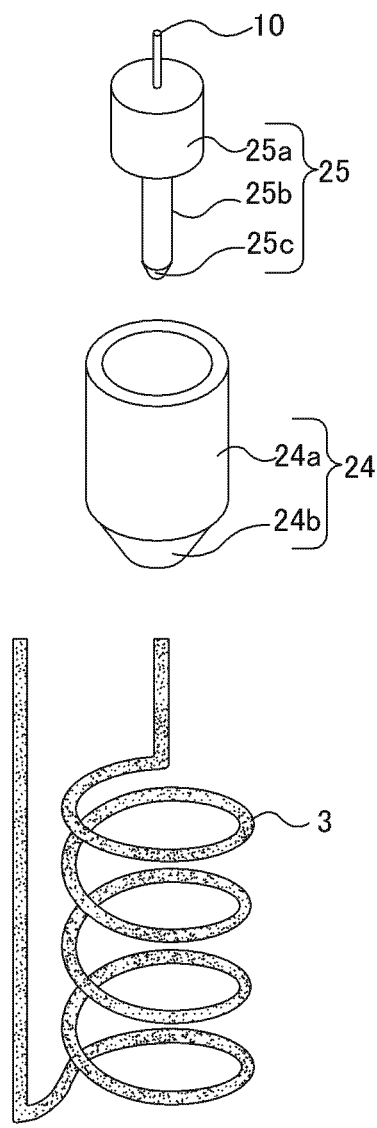
FIG. 3 is a schematic assembling view of the plasma treatment apparatus according to Embodiment 2.

As shown in FIG. 3, when inside dielectric block 25b having a protrusion shape on the bottom end side is disposed inside outside dielectric block 25a, a circular plasma generation area is formed between the side surface of outside dielectric block 25a and the side surface of inside dielectric block 25b. Since the circular plasma generation area is formed, it is possible to suppress the fluctuation of plasma and to realize generation of more stable plasma. Meanwhile, as shown in FIG. 3, coil 3 is disposed at the outer periphery of outside dielectric block 24.

It is possible to generate more stable plasma by using chamber 30 having a circular plasma generation area formed in inside 7. For example, in a case in which the plasma ejection port as the opening portion has a long and thin linear shape (long form), the shape of the chamber also needs to be a long and thin shape (long form). However, when a circular plasma generation area is made to be formed in inside 7 of chamber 30, it is possible to stably generate long and thin (long-shaped) high-density plasma. Meanwhile, the fluctuation of plasma in the vertical direction in FIG. 2 (for example, a phenomenon in which plasma changes from moment to moment into the states as shown by P1 and P2 in the drawing) appears when high frequency waves are driven in a continuous waveform. Therefore, it is possible to suppress the fluctuation of plasma and to more stably generate plasma by driving pulses in the same manner as in Embodiment 1.

Embodiment 3

Figure 4:
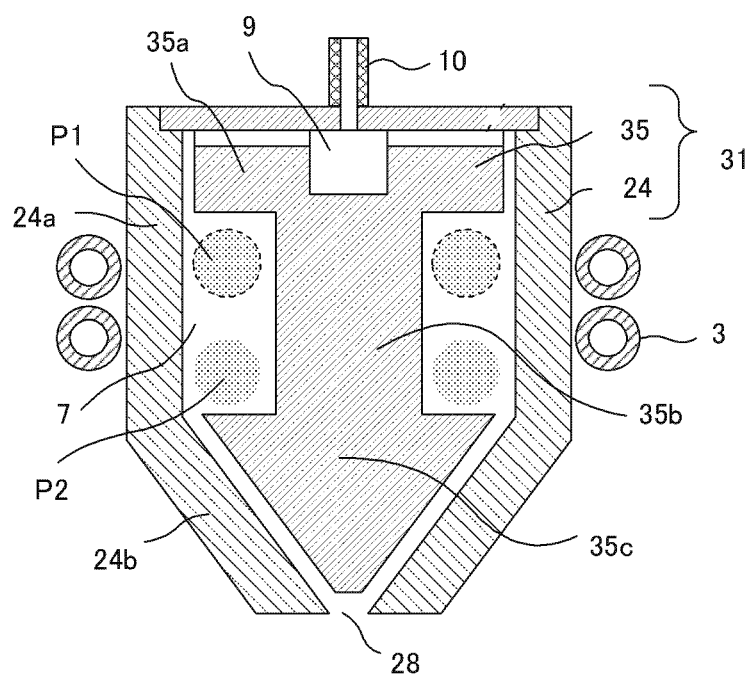
FIG. 4 is a cross-sectional view showing the outline of a plasma treatment apparatus according to Embodiment 3.
Figure 5:
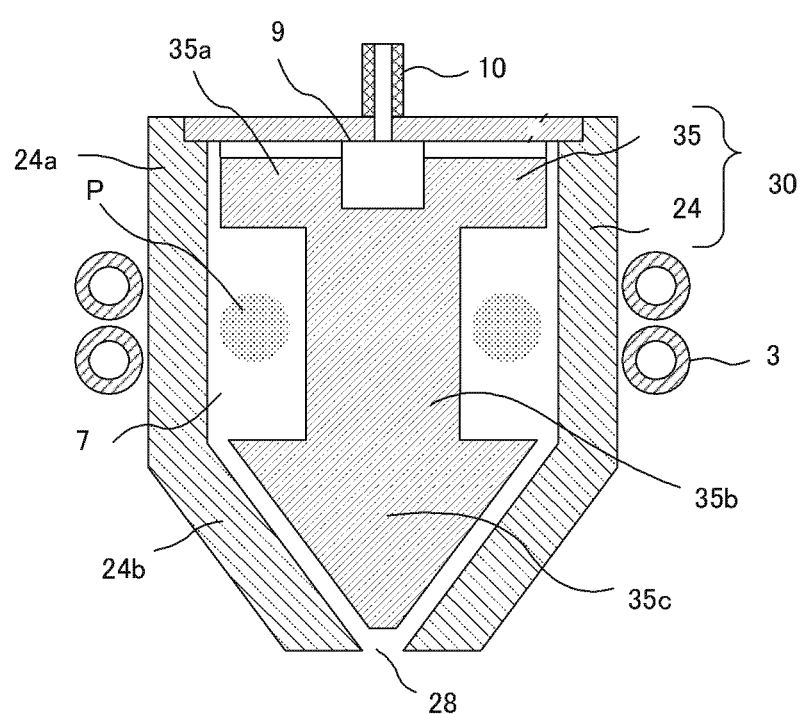
FIG. 5 is a cross-sectional view showing the outline of the plasma treatment apparatus according to Embodiment 3.

FIGS. 4 and 5 are cross-sectional views showing the outline of a plasma treatment apparatus according to Embodiment 3, and are cross-sectional views of inductively-coupled plasma torch unit T cut at a surface perpendicular to the base material.

As shown in FIG. 4, the plasma treatment apparatus according to Embodiment 3 is configured in the same manner as in Embodiment 2 except that taper portion 25c of FIG. 2 is substituted by circular truncated cone-shaped taper portion 35c having a diameter of the bottom surface that is larger than the diameter of protrusion 35b as shown in FIG. 4. That is, Embodiment 3 is different from Embodiment 2 in that a groove is formed on the side portion of inside dielectric block 35, and a plasma generation area is formed between the groove and the inner wall surface of outside dielectric block 24. Even in the above configuration, the fluctuation of plasma in the vertical direction in the drawing (for example, a phenomenon in which plasma changes from moment to moment into the states as shown by P1 and P2 in the drawing) appears when high frequency waves are driven in a continuous waveform. Therefore, it is possible to suppress the fluctuation of plasma and to more stably generate plasma by driving pulses in the same manner as in Embodiment 1.

When the drive frequency of pulses is increased, and the on time and the off time are decreased as shown in FIG. 4, the generation location of the doughnut plasma concentrates at P, and stabilized plasma can be obtained.

The plasma treatment apparatuses and methods described above are simply exemplified typical examples within the application scope of the invention.

For example, in a case in which inductively-coupled plasma torch unit T is relatively moved with respect to base material mounting table 1, the inductively-coupled plasma torch unit may be scanned over fixed base material mounting table 1, and base material mounting table 1 may be scanned over fixed inductively-coupled plasma torch unit T.

In addition, it becomes possible to treat the vicinity of the surface of base material 2 at a high temperature using a variety of configurations of the invention. It is needless to say that the invention can be applied to crystallization of a TFT semiconductor film or modification of a solar cell semiconductor film which are described in detail in the related art. In addition, the invention can be applied to a variety of surface treatments such as cleaning or degassing reduction of protective layers in plasma display panels, surface flattening or degassing reduction of dielectric layers including a collection of silica fine particles, reflow of a variety of electronic devices, and plasma doping in which a solid impurity source is used. In addition, the invention can be applied to a method of manufacturing a solar cell in which powder obtained by grinding a silicon ingot is coated on a base material, and is irradiated to plasma so as to be melted, thereby obtaining a polycrystalline silicon film.

In addition, in order to facilitate ignition of plasma, it is also possible to use an ignition source. As the ignition source, an ignition spark apparatus or the like which is used in a gas water heater and the like can be used.

In addition, although the term "thermal plasma" is used in the description for simplification, it is difficult to strictly differentiate thermal plasma and low-temperature plasma, and it is also difficult to differentiate the kinds of plasma using the thermal equilibrium alone as described in, for example, "Non-equilibrium in thermal plasmas" by Yasunori Tanaka in Journal of Plasma and Fusion Research, Vol. 82, No. 8 (2006), pp. 479 to 483. One of the objects of the invention is to thermally treat a base material, and the invention can be applied to fields relating to techniques that irradiate high-temperature plasma regardless of terminologies such as thermal plasma, thermal equilibrium plasma, or high-temperature plasma.

In addition, a case in which the vicinity of the surface of a base material is thermally treated uniformly at a high temperature within an extremely short period of time has been exemplified in detail. However, even in a case in which a plasma originating from a reactive gas or a plasma and a reactive gas stream are irradiated to a base material at the same time so as to carry out a low-temperature plasma treatment of the base material, the invention can be applied. It is possible to irradiate a plasma originating from a reactive gas to a base material and to carry out etching or a CVD treatment by incorporating the reactive gas into a plasma gas. Alternatively, a gas including a reactive gas as a shield gas may be supplied from a separate nozzle while using a noble gas or a gas obtained by adding a small amount of $H_2$ gas to a noble gas as the plasma gas. In addition, it is also possible to irradiate a plasma and a reactive gas stream to a base material at the same time, and to carry out a plasma treatment such as etching, CVD, or doping. When a gas mainly including argon is used as the plasma gas, thermal plasma is generated as exemplified in detail in the examples.

Meanwhile, when a gas mainly including helium is used as the plasma gas, it is possible to generate relatively low-temperature plasma. The above method enables a treatment such as etching or film formation without significantly heating a base material. A halogen-containing gas, for example, $C_xF_y$ (x and y are natural numbers) or $SF_6$ can be used as a reactive gas used for etching, and it is possible to etch silicon, silicon compounds, and the like.

When $O_2$ is used as the reactive gas, removal of organic substances, resist ashing, and the like become possible. Monosilane, disilane, and the like can be used as a reactive gas for CVD, and it becomes possible to form a film of silicon or a silicon compound. Alternatively, when a gas mixture of a silicon-containing organic gas represented by tetraethoxysilane (TEOS) and $O_2$ is used, it is possible to form a silicon-oxidized film.

In addition, a variety of low-temperature plasma treatments such as a surface treatment that modifies water repellency and hydrophilicity is possible. In the invention, since an inductively-coupled plasma torch is used, it is difficult to transit to an arc discharge even when a high power density per unit volume is injected. Therefore, higher-density plasma can be generated. As a result, a fast reaction rate is obtained, and it is possible to efficiently treat the entire desired area to be treated in the base material within a short period of time.

The present application claims priority based on a Japanese Patent Application previously filed by the same applicant, that is, Japanese Patent Application NO. 2011-267962

(filed on Dec. 7, 2011), and the contents of the specification are incorporated herein as a part of the invention.

INDUSTRIAL APPLICABILITY

As described above, the invention can be applied to crystallization of a TFT semiconductor film or modification of a solar cell semiconductor film. In a surface treatment of a base material in which the vicinity of the surface of the base material is thermally treated uniformly at a high temperature within an extremely short period of time, the invention is useful to efficiently treat the entire desired area to be treated in the base material within a short period of time by stably and efficiently generating plasma. The invention can be applied to cleaning or degassing reduction of protective films in plasma display panels, surface flattening or degassing reduction of dielectric layers including a collection of silica fine particles, reflow of a variety of electronic devices, and plasma doping in which a solid impurity source is used.

In addition, the invention is useful to efficiently treat the entire desired area to be treated in a base material within a short period of time in low-temperature plasma treatments such as etching, film formation, doping, and surface modification in manufacturing a variety of electronic devices and the like.

REFERENCE SIGNS LIST

1 Base material mounting table
2 Base material
T Inductively-coupled plasma torch unit (unit)
3 Solenoid coil (coil)
4 Outside dielectric block
5 Inside dielectric block
7 Inside (of chamber)
8 Plasma ejection port
9 Gas pipe (plasma gas manifold)
10 Gas supply pipe
22 Thin film

The invention claimed is:
1. A plasma treatment apparatus including an inductively-coupled plasma torch unit, the inductively-coupled plasma torch unit comprising:
 a chamber having an outside dielectric block having an opening portion which serves as a plasma ejection port at a bottom end of the outside dielectric block and an inside dielectric block, the inside dielectric block including:
  an inside dielectric block main body disposed at a top end of the outside dielectric block and having a gas pipe that introduces gas into an inside of the chamber, the gas pipe being communicated with a gas supply pipe;
  a protrusion provided in a protruding manner from the inside dielectric block main body; and
  an inside taper portion provided at a front end of the protrusion;
  a circular plasma generation area being formed between a side surface of the outside dielectric block and a side surface of the inside dielectric block;
 a solenoid coil disposed laterally to a space which is formed between the inside dielectric block and the outside dielectric block, the plasma treatment apparatus further including:
 a high-frequency power supply having a pulse modulation function which is connected to the solenoid coil and supplies a pulse-modulated high-frequency power to the solenoid coil; and
 a base material mounting table disposed on a plasma ejection port side, wherein:
 the chamber is circular and has a long shape;
 the plasma ejection port is formed into a long linear shape;
 the solenoid coil has a long shape;
 a moving mechanism is provided to relatively move the chamber and the base material mounting table perpendicularly with respect to the longitudinal direction of the plasma ejection port;
 the outside dielectric block includes an outside dielectric block main body having a plasma generation area formed inside and an outside taper portion having the plasma ejection port at the bottom end whose diameter becomes narrower in a direction from an opening portion of the outside dielectric block main body on a side of the base material mounting table toward the base material mounting table;
 the taper portion has a flat edge parallel to a direction in which the chamber and the base material mounting table relatively move; and
 a space formed between the inside dielectric block and the outside dielectric block comprises:
  a first space between the inside dielectric block main body of the inside dielectric block and the outside dielectric block main body of the outside dielectric block;
  a second space between the protrusion of the inside dielectric block and the outside dielectric block main body of the outside dielectric block; and
  a third space between the inside taper portion of the inside dielectric block and the outside taper portion of the outside dielectric block,
 the first space and the third space having smaller gaps than that of the second space.

* * * * *